United States Patent [19]

Alexander et al.

[11] Patent Number: 4,477,970
[45] Date of Patent: Oct. 23, 1984

[54] P.C. BOARD MOUNTING METHOD FOR SURFACE MOUNTED COMPONENTS

[75] Inventors: Robert P. Alexander, Schaumburg; Robert J. Pichia, Westchester; Stephen F. Dauksch, Schaumburg, all of Ill.

[73] Assignee: Motorola, Inc., Schaumburg, Ill.

[21] Appl. No.: 364,380

[22] Filed: Apr. 1, 1982

[51] Int. Cl.³ ............................................. H05K 3/30
[52] U.S. Cl. ........................................ 29/837; 29/840
[58] Field of Search ................. 29/832, 834, 835, 836, 29/827, 840; 174/52 H, 52 P, 52 FP, 68.5; 357/74, 80, 81; 361/400, 401, 406

[56] References Cited

U.S. PATENT DOCUMENTS

| | | | |
|---|---|---|---|
| 3,191,098 | 6/1965 | Fuller | 174/68.5 X |
| 3,554,821 | 1/1971 | Caulton et al. | 29/832 X |
| 3,707,039 | 12/1972 | Niemirovich . | |
| 3,934,336 | 1/1976 | Morse . | |
| 3,991,347 | 11/1976 | Hollyday . | |
| 4,064,356 | 12/1977 | Marler, Jr. et al. . | |
| 4,213,141 | 7/1980 | Colussi | 357/74 |
| 4,230,385 | 10/1980 | Ammon et al. . | |
| 4,246,697 | 1/1981 | Smith | 29/827 |
| 4,415,917 | 11/1983 | Chiba et al. | 29/827 X |

*Primary Examiner*—Howard N. Goldberg
*Assistant Examiner*—Carl J. Arbes
*Attorney, Agent, or Firm*—F. John Motsinger; Edward M. Roney; James W. Gillman

[57] ABSTRACT

A method for preparing a printed circuit board for mounting of surface mounted RF components such that the lead inductance of the components is minimized. The process consists of producing plated through apertures in the printed circuit board to create a component body hole with lead contacts extending to the edge of the component body hole. The resulting aperture is then blanked to remove portions of the metal lining to provide electrical isolation between the lead contacts while maintaining lead contacts that extend to the edge of the component body hole. A component is then soldered into position such that solder is wicked through the plated through apertures to create solder contact of the leads at the edge of the component body hole. This results in substantial reduction in lead inductance improving RF amplifier gain and stability and improving bandwidth characteristics.

5 Claims, 5 Drawing Figures

P.C. BOARD MOUNTING METHOD FOR SURFACE MOUNTED COMPONENTS

BACKGROUND OF THE INVENTION

1. Field of the Invention

This invention relates generally to the mounting of components on printed circuit boards and in particular to a method of mounting surface mounted components which minimizes lead inductance.

2. Description of the Prior Art

In prior art printed circuit board assemblies wherein RF devices are mounted in a blanked cut-out in the printed circuit board, it has been necessary to make solder connections to the device leads at some distance from the device body. When mounting such surface mounted devices, (for example, flange, macro-X, and other RF type packages) are utilized, the length of the lead from the point exiting the main body of the device to the point at which the lead is soldered to the electrical circuit on the printed circuit board determines the lead inductance. For RF circuitry this lead inductance decreases RF gain and stability due to degenerative feedback and in addition decreases bandwidth. Thus, it is desirable to minimize the lead length thereby minimizing lead inductance.

SUMMARY OF THE INVENTION

It is an object of this invention, therefore, to provide an improved method of mounting surface mounted printed circuit board components to minimize lead length.

It is another object of the invention to provide an improved method of mounting RF surface mounted printed circuit board components to improve RF amplifier gain stability and improve bandwidth characteristics.

It is yet another object of the invention to provide an improved method of mounting surface mounted printed circuit board components which is economical and reliable.

Briefly, according to the invention, a method is provided for preparing a printed circuit board for a surface mounted component mounted in a component body cut-out in the printed circuit board and having leads extending parallel to the conductive lead contacts on the printed circuit board surface. The method includes the step of producing at least one metal lined aperture in the printed circuit board for mounting the surface mounted component and positioned such that lead contacts extend to the edge of the component body cut-out. The component body cut-out portion of the metal lined aperture is then further cut out or blanked such that the metal lining is sheared away to provide isolated lead contacts that extend to the edge of the component body.

BRIEF DESCRIPTION OF THE DRAWINGS

The features of the present invention which are believed to be novel are set forth with particularity in the appended claims. The invention, together with further objects and advantages thereof, may best be understood by reference to the following description when taken in conjunction with the accompanying drawings.

DETAILED DESCRIPTION OF THE PREFERRED EMBODIMENT

Figure 1:
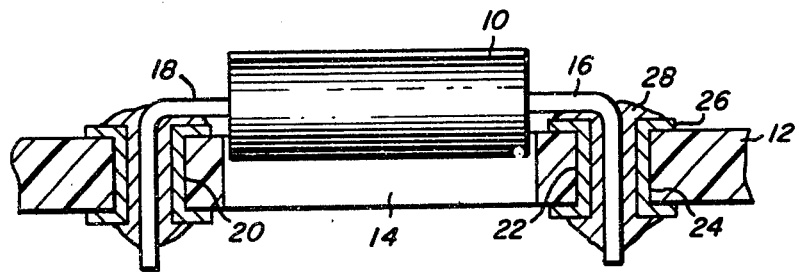
FIG. 1 is a cross sectional drawing illustrating the prior art method of mounting surface mounted components.

Referring now to FIG. 1, there is shown a cross sectional view of a surface mounted component 10 mounted on a printed circuit board 12 utilizing the prior art technique. The electrical component 10 is mounted in a component body hole 14, as shown, with the leads 16, 18 extending parallel to the printed circuit board surface for a predetermined distance. The component leads 16, 18 are then bent at right angles, as shown, and inserted in apertures 20, 22 in the printed circuit board. The apertures 20, 22 are lined with metallization as indicated at 24 and the metal lining makes contact with conductive lead contacts on the surface of the printed circuit board as shown at 26. In the final assembly process, the printed circuit board is typically waveline soldered from the bottom side such that solder is wicked up through the lead aperatures 20, 22 thereby solder joining the leads 16, 18 to the conductive lead contacts as shown at 28. When this technique is utilized, a relatively long lead length exists from the edge of the component body 10 to the contact point on a printed circuit board, which is approximately at the point of the lead aperture. This long lead length results in substantial lead inductances which reduces RF amplifier gain and stability, and decreases bandwidth.

Figure 2:
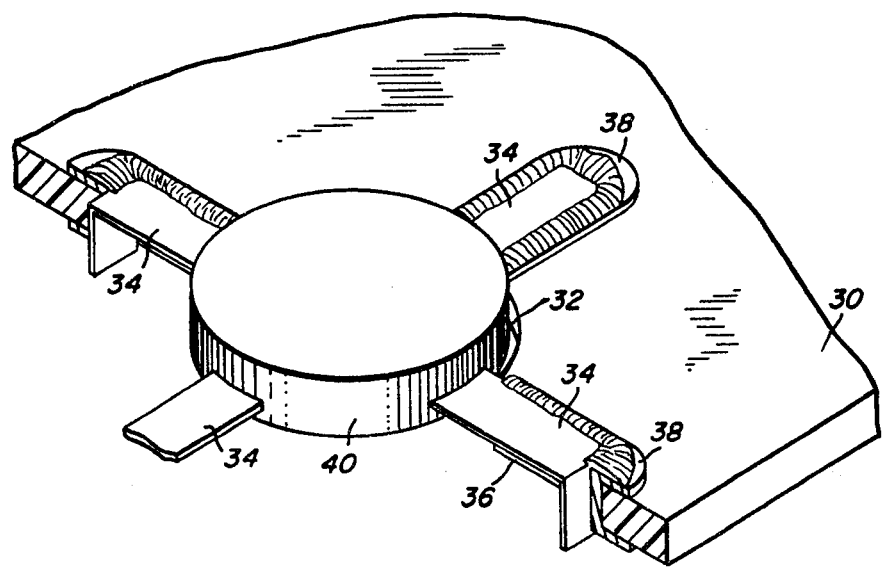
FIG. 2 is a perspective cross section illustrating one embodiment of the invention mounting method for a macro-X packaged RF transistor.
Figure 3:
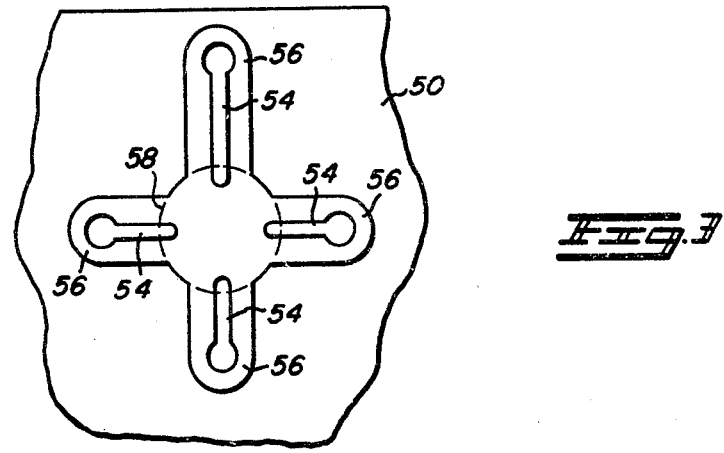
FIG. 3 is a plan view illustrating the inventive mounting method for a macro-X packaged RF transistor.

Referring now to FIGS. 2 and 3, there is shown a perspective cross ssectional view of a macro-X surface mounted RF transistor 40 mounted on a printed circuit board 30/50 utilizing the inventive mounting method. The surface mounted component 40 is mounted in a component body hole 32/58 in the printed circuit board 30/50 with leads 34 extending parallel to the top surface of the printed circuit board 30/50 bent at right angle at the ends and inserted into lead aperture holes 57, as shown. The leads 34 of the surface mounted component 40 are arranged over a set of slots 36/54 which are configured radially from the center point of the component body hole 32/58. Each slot 54, as illustrated in cross section at 36, has metal lining from the bottom surface of the printed circuit board 30/50 to the top surface where the aperture metal lining meets the lead contact metalization 38/56. These metal lined slots 36/54, extend to the edge of the component body hole 32/58. In mounting the component 40, the printed circuit board 30/50 is wave soldered from the bottom resulting in solder being wicked up through the metal lined slots 36/54, thereby solder joining the leads 34 to the lead contacts 38/56 as shown. The solder joining of the leads 34 to the lead contact 38/56 extends all the way to the edge of the component body hole 32/58, as illustrated in FIG. 2.

FIG. 3 is a plan view illustrating the steps involved in producing the printed circuit board configuration illustrated in FIG. 2. In the first step of the process, the printed circuit board 50 is processed to produce a set of metal lined slots 54 which are plated through from the bottom surface of the printed circuit board to the lead contact metalization 56 on the top surface of the printed circuit board 50. In the second step of the process, a blanking die 58 is utilized to punch a component body hole 58 which is not metal lined and which intercepts the ends of the metal lined slots 54, thereby creating a set of metal lined slots 54 with metalization extending to the edge of the component body hole. As a result, when a surface mounted component (not shown) is properly oriented over the metal lined slots and wave soldered, the solder is wicked up through the metal lined slots solder joining the leads to the lead contacts 56 all the way along to the very edge of the component body hole 58/32 (see FIG. 2). This results in substantially reduced lead lengths for the component, thereby substantially improving high frequency performance of the circuitry.

Figure 4:
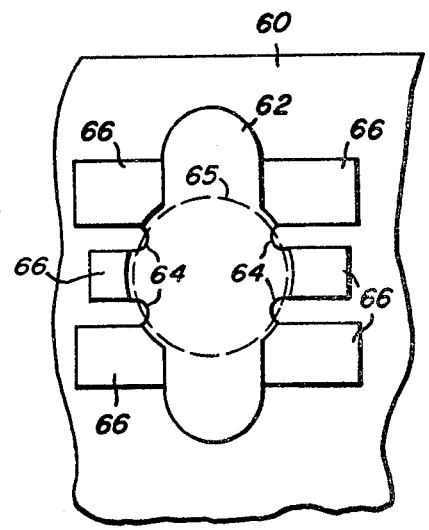
FIG. 4 is a plan view illusgtrating the inventive mounting method for a ceramic flange packaged RF transistor.

Referring now to FIG. 4 there is shown a plan view illustrating the steps for mounting of a ceramic flange RF transistor utilizing the present invention. A plated through aperture 62 is first produced in the printed circuit board 60. This plated through aperture 62 is formed to receive the component body of a ceramic flange transistor (not shown). This metal lined aperture 62 includes a set of properly positioned protrusions 64 which are located at the points where the lead contacts 66 intersect the edge of the metal lined aperature 62, as shown. In the second step of the process, a blanking die 65 is used to punch out (the protrusions 64 as indicated at 65) thereby creating non-plated through points 64 to electrically isolate the lead contacts 66 from one another. The appropriate ceramic RF transistor is then placed in the component body hole 62 with the leads extending over and contacting the lead contacts 66. The printed circuit board would then be soldered from the top of the printed circuit board resulting in solder wicking along the metal lined areas resulting in the component leads (not shown) being solder joined to the component lead contacts 66 at the edge of the component body hole 62.

Figure 5:
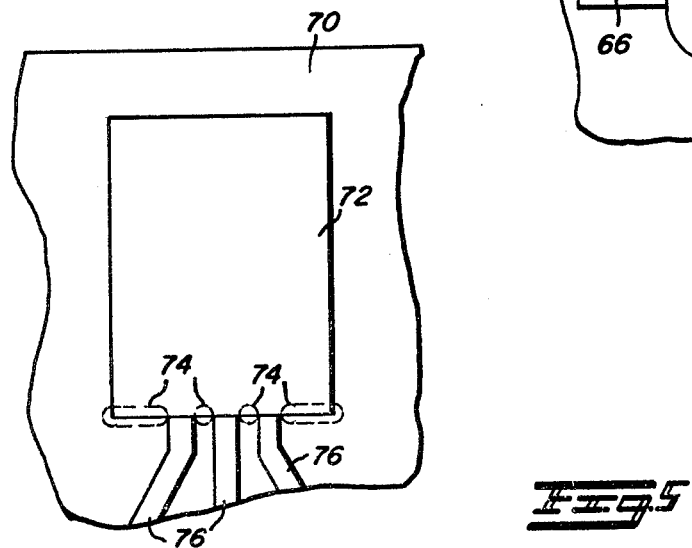
FIG. 5 is a plan view illustrating the inventive mounting method for a TO-220 packaged RF transistor.

Referring now to FIG. 5, there is shown a plan view illustrating the steps necessary for surface mounting of a TO-220 RF transistor using the present invention. A metal lined aperture 72 is first produced in the printed circuit board 70 as shown. A blanking die 74 is then used to blank or cut out holes shown at 74 to produce areas which are not plated through 74 between the lead contacts 76. A TO-220 transistor is then placed in the metal lined aperture 72 with the leads extending over and contacting the lead contact 76. The printed circuit board 70 is then soldered from the top side such that solder is wicked along the plated through areas 76 to solder join the leads of the TO-220 transistor to the lead contact 76 at the edge of the component body hole 72.

While several embodiments of the invention have been described and shown, it should be understood that other variations and modifications may be implemented. It is therefore contemplated to cover by the present application any and all modifications and variations that fall within the true spirit and scope of the basic underlining principles disclosed and claimed herein.

What is claimed is:

1. A method for preparing a printed circuit board for surface mounted components mounted in a component body hole in the printed circuit board and having leads extending parallel to conductive lead contacts on the printed circuit board surface, the method comprising the steps of:
   providing a printed circuit board having at least one body hole with a top surface for mounting said component;
   metal lining said body hole to define a metal lined aperture;
   metalizing said printed circuit board to define said conductive lead contacts;
   positioning said conductive lead contacts into at least one hole such that at least one of said conductive lead contacts extends to the edge of and into said body hole; and
   blanking a component body hold portion of the metal lined aperture such that the metal lining is cut away to provide isolated conductive lead contacts that extend to the edge of the component body hole.

2. The method of claim 1 wherein the steps of producing comprises producing a plurality of metal lined elongated apertures arranged radially from a center point and bordered by conductive lead contacts, and wherein the step of blanking comprises blanking a component body hole centered on the center point of the elongated apertures such that the ends of the elongated apertures are removed thereby creating metal lined slots and conductive lead contacts extending to the edge of the component body hole.

3. The method of claim 1, wherein the step of providing further comprises providing a metal lined aperture forming a component body hole having a plurality of conductive lead contacts arranged at predetermined locations along and extending from the perimeter of the aperture and having small protrusions extending into the aperture opening, and wherein the blanking step comprises removing, at the locations between the conductive lead contacts, the protrusions thereby isolating the conductive lead contacts.

4. A method of claim 1, wherein the step of providing further comprises providing a metal lined aperture forming a component body hole having a plurality of conductive lead contacts arranged at predetermined locations along and extending from the perimeter of the aperture, and wherein the blanking steps comprises removing portions of the metal lining from the perimeter of the aperture at locations between the conductive lead contacts thereby electrically isolating the conductive lead contacts.

5. The method of claims 1, 2, 3 or 4 further comprising the steps of inserting a surface mounted component in the component body hole with the leads extending over and contacting the lead contacts, and wicking solder through said plated through apertures to solder join the surface mounted component leads to the lead contacts up to the edge of the component body.

* * * * *

UNITED STATES PATENT AND TRADEMARK OFFICE
CERTIFICATE OF CORRECTION

PATENT NO. : 4,477,970

DATED : October 23, 1984

INVENTOR(S) : ALEXANDER, et al.

It is certified that error appears in the above-identified patent and that said Letters Patent is hereby corrected as shown below:

In column 4, lines 23 and 24, delete "producing comprises producing" and insert --providing further comprises providing--.

Signed and Sealed this

Second Day of July 1985

[SEAL]

Attest:

DONALD J. QUIGG

Attesting Officer     Acting Commissioner of Patents and Trademarks